(12) United States Patent
Ueda

(10) Patent No.: US 6,894,365 B2
(45) Date of Patent: May 17, 2005

(54) SEMICONDUCTOR DEVICE HAVING AN INTEGRAL RESISTANCE ELEMENT

(75) Inventor: Yoshinori Ueda, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 09/431,593

(22) Filed: Nov. 1, 1999

(65) Prior Publication Data

US 2002/0195661 A1 Dec. 26, 2002

(30) Foreign Application Priority Data

Nov. 9, 1998 (JP) .......................... 10-317265

(51) Int. Cl.⁷ .............................................. H01L 29/00
(52) U.S. Cl. ...................... 257/536; 257/347; 257/350; 257/360; 257/364; 257/377; 257/379; 257/380; 257/381; 257/413; 257/537
(58) Field of Search ................. 257/347, 350, 257/360, 364, 377, 380, 379, 413, 536, 537, 381

(56) References Cited

U.S. PATENT DOCUMENTS

| | | | | |
|---|---|---|---|---|
| 4,804,636 A | * | 2/1989 | Groover, III et al. | 437/52 |
| 5,031,019 A | | 7/1991 | Kosaka et al. | |
| 5,266,156 A | * | 11/1993 | Nasr | 156/656 |
| 5,621,232 A | * | 4/1997 | Ohno | 257/288 |
| 5,911,114 A | * | 6/1999 | Naem | 138/684 |
| 5,977,598 A | * | 11/1999 | Chen et al. | 257/380 |
| 6,100,173 A | * | 8/2000 | Gardner et al. | 438/592 |

FOREIGN PATENT DOCUMENTS

| | | | | |
|---|---|---|---|---|
| JP | 59-191368 | | 10/1984 | |
| JP | 61-191060 | | 8/1986 | |
| JP | 61-208862 | | 9/1986 | |
| JP | 63-133672 A | * | 6/1988 | .................. 257/413 |
| JP | 4-22164 | | 1/1992 | |
| JP | 5218306 | | 8/1993 | |
| JP | 7115173 | | 5/1995 | |
| JP | 9-36310 | | 2/1997 | |
| JP | 9-97876 | | 4/1997 | |
| JP | 09097876 A | * | 4/1997 | ........... H01L/27/04 |
| JP | 9232521 | | 9/1997 | |

OTHER PUBLICATIONS

U.S. Appl. No. 07/289,909, filed Dec. 27, 1988, now abandoned.

* cited by examiner

Primary Examiner—Tom Thomas
Assistant Examiner—Matthew E. Warren
(74) Attorney, Agent, or Firm—Cooper & Dunham LLP

(57) ABSTRACT

A resistance element of a semiconductor device includes a first resistance pattern and a second resistance pattern formed adjacent to the first resistance pattern at a lower level, wherein the second resistance pattern is defined by the first resistance pattern in a self-aligned relationship and connected to the first resistance pattern in series.

7 Claims, 10 Drawing Sheets

SEMICONDUCTOR DEVICE HAVING AN INTEGRAL RESISTANCE ELEMENT

BACKGROUND OF THE INVENTION

The present invention generally relates to semiconductor devices and more particularly to a semiconductor device having a resistance element and a fabrication process thereof.

The present invention covers not only a resistance element formed on a semiconductor chip, but also an integrated circuit in which such a resistance element is integrated on a common chip, together with other elements such as transistors and/or capacitors.

In semiconductor devices, resistance elements are formed generally by a patterning process of a polysilicon layer, wherein such a polysilicon layer may be formed on a diffusion region on a semiconductor substrate or on an insulation film covering the semiconductor substrate.

In order to minimize the variation of the resistance of such resistance elements, it has been practiced to minimize the sheet-resistance variation of the conductive layer from which the resistance pattern is formed. Alternatively, efforts are made to improve the precision of the patterning process.

In order to minimize the sheet-resistance variation of the conductive layer, various proposals have been made so far, including controlling of the thickness of the conductive layer or improving the quality of the conductive layer. See the Japanese Laid-Open Patent Publication 7-115173 or 9-232521.

With regard to the approach via improvement of the patterning precision of the resistance elements, there is a proposal to planarize the polysilicon layer such that the precision of the patterning is improved. See the Japanese Laid-Open Patent Publication 5-218306. Further, there is a proposal to improve the patterning precision by disposing a dummy pattern adjacent to the resistance pattern. The present invention to be described later also adopts the approach to minimize the resistance variation by improving the precision of the resistance pattern elements.

According to the foregoing approach of improving the patterning precision of the resistance, on the other hand, it has been difficult to achieve a significant improvement with regard to the resistance variation, particularly when the size of the resistance element is small. Thus, in order to avoid the foregoing problem, it has been practiced to form the resistance elements to has a relatively large size such that the variation in the patterning of the resistance element can be ignored. Such an approach, on the other hand, reduces the area of the semiconductor chip on which other elements such as transistors or interconnection patterns could otherwise have been formed. Thus, such an approach has caused an increase in the size and hence the cost of the semiconductor devices.

FIG. 1 shows an example of such a polysilicon resistance element.

Referring to FIG. 1, there is provided a number of polysilicon resistance patterns 2 on a surface of a substrate (not shown) in a parallel relationship with each other, wherein the resistance patterns 2 are connected in series by conductor patterns 4 also provided on the substrate to form a desired resistance element having a desired resistance value. In the example in which the polysilicon layer has a sheet resistance of $5\Omega/\square$ and ten such resistance patterns 2, each having a width W of 1 $\mu$m and a length L of 100 $\mu$m, are connected in series, the resistance element thus formed shows a nominal resistance value of 5000 $\Omega$ (=5 $\Omega/\square \times (100\ \mu\text{m} \times 1\ \mu\text{m}) \times 10$).

Thus, when the resistance patterns 2 are formed with a size tolerance of 0.1 $\mu$m, the resistance value of the resistance element may vary within a range of $\pm 500\Omega$ or $\pm 10\%$. In order to reduce such a variation of the resistance in the resistance element, it has been necessary to increase the size W and/or L for each of the resistance patterns 2. As noted already, however, such an approach causes a decrease in the area of the semiconductor chip on which other devices are formed.

SUMMARY OF THE INVENTION

Accordingly, it is a general object of the present invention to provide a novel and useful semiconductor device having a resistance pattern and a fabrication process thereof wherein the foregoing problems are eliminated.

Another and more specific object of the present invention is to provide a semiconductor device having a resistance pattern wherein direct influence of the patterning precision of the resistance pattern on the resistance value of the resistance element is eliminated.

Another object of the present invention is to provide a semiconductor device, comprising:

a substrate; and a resistance element formed on said substrate, said resistance pattern comprising:

a first resistance pattern provided on said substrate at a first level; and a second resistance pattern provided adjacent to said second resistance pattern at a second level lower than said first level, said second resistance pattern being connected in series to said first resistance pattern, said second resistance pattern having an edge defined by said first resistance pattern.

Another object of the present invention is to provide a method of fabricating a semiconductor device, comprising the steps of:

forming a conductive layer on a Si layer;

patterning said conductive layer selectively with respect to said Si layer, to form a conductor pattern;

depositing a metal film on said Si layer such that said conductive film covers said conductor pattern and an exposed part of said Si layer exposed by said conductive film;

annealing said metal film to form a salicide pattern in correspondence to said conductive pattern as a first resistance pattern, said annealing step further forming a salicide pattern in said Si layer in correspondence to said exposed part of said Si layer as a second resistance pattern; and forming a conductor pattern connecting said first resistance pattern and said second resistance pattern in series.

According to the present invention, the second resistance pattern, forming a complementary pattern with respect to the first resistance pattern, effectively compensates for any resistance change caused by the size variation occurred in the first resistance pattern, as the second resistance pattern is formed by a self-alignment process that uses the first resistance pattern as a self-alignment mask. When the width of the first resistance pattern is increased or decreased as a result of the error at the time of the patterning of the resistance pattern, for example, the width of the second resistance pattern decreases or increases correspondingly, and the change of the overall resistance of the resistance element, formed by the series connection of the first and second resistance patterns, is effectively avoided. Thereby, the resistance element can be formed to have a miniaturized size by using a high-resolution photolithographic patterning process, and the size of the semiconductor device can be reduced.

By forming the first resistance pattern by a polycide layer, it becomes possible to increase the sheet resistance as compared with the case of using a diffused silicide layer. The use of polycide is also advantageous when integrating a polysilicon capacitor together with the semiconductor device.

In the case the second resistance pattern is formed in a semiconductor substrate in the form of a salicide (self-aligned silicide) pattern, it is preferable to control the doping of the semiconductor substrate such that the parasitic MOS transistor, formed in the semiconductor substrate by the foregoing first and second resistance patterns, has a threshold voltage exceeding the supply voltage used in the semiconductor device. By doing so, the resistance element can be used in the semiconductor device without restricting the voltage appearing across the resistance element.

Other objects and further features of the present invention will become apparent from the following detailed description when read in conjunction with the attached drawings.

DETAILED DESCRIPTION OF THE INVENTION

[First Embodiment]

Figure 2A:
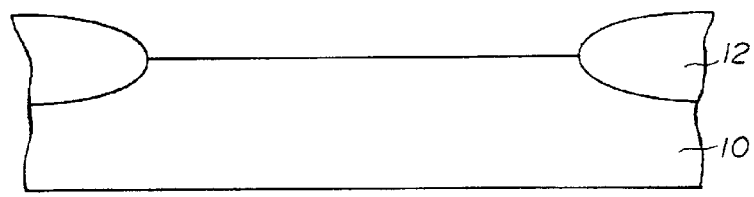
FIGS. 2A–2K are diagrams showing the fabrication process of a resistance element according to a first embodiment of the present invention.
Figure 2B:
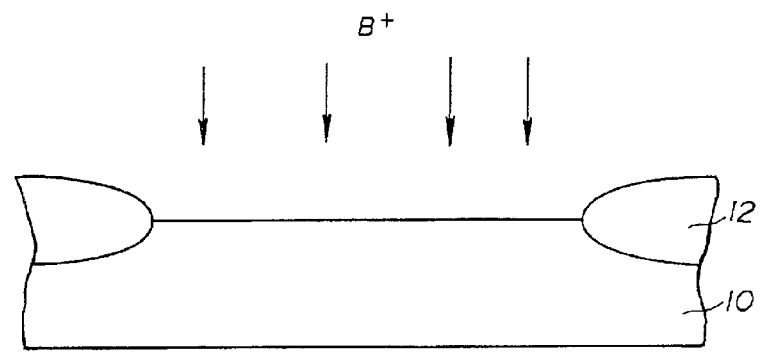

FIGS. 2A and 2B show the fabrication process of a semiconductor device according to a first embodiment of the present invention.

Referring to FIG. 2A, a field oxide film 12 is formed on a Si substrate 10 of the p-type by a LOCOS process with a thickness of about 450 nm, such that the field oxide film 12 defines a region on which a resistance element is to be formed. Although not illustrated, the field oxide film 12 also defines a region, on the Si substrate 10, in which a transistor is to be formed.

Next, in the step of FIG. 2B, an ion implantation process of $B^+$ is conducted under an acceleration voltage of 10 keV with a dose of $2 \times 10^{14}$ cm$^{-2}$, for example, into the active region defined in the step of FIG. 2A, such that there occurs no turning-on of a parasitic MOS transistor which is formed in the active region as a result of formation of the resistance element, even in such a case a voltage equivalent to the supply voltage appears across the resistance element to be formed.

Figure 2C:
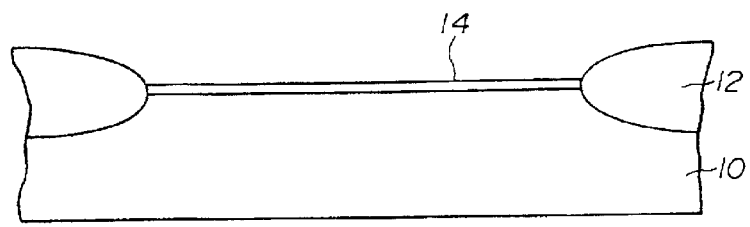

Next, in the step of FIG. 2C, an oxide film 14 is formed on the surface of the active region by conducting a wet oxidation process at 850° C. for 15 minutes, wherein the wet oxidation process thus forming the oxide film 14 induces a simultaneous formation of a gate oxide film in correspondence to the part of the substrate where the transistor is to be formed.

Figure 2D:
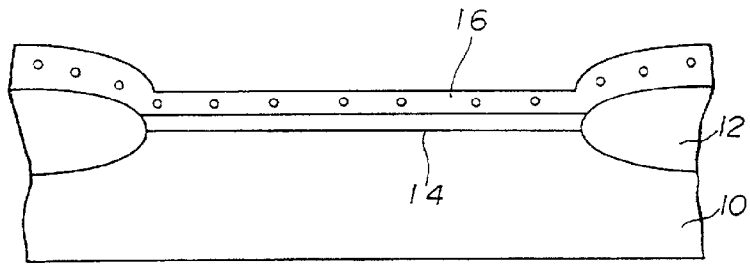
Figure 2E:
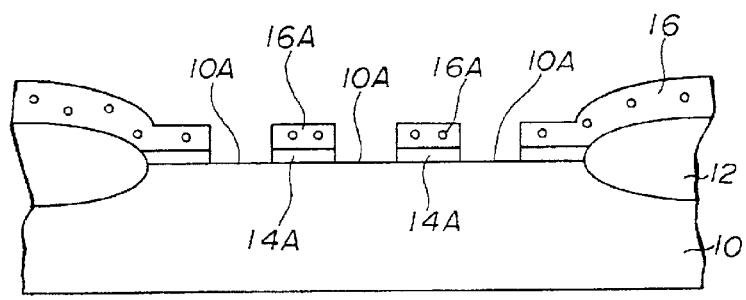

After the formation of the oxide film 14, a polysilicon film 16 is deposited in the step of FIG. 2D on the structure of FIG. 2C with a thickness of about 150 nm, followed by a photolithographic patterning process of the polysilicon film 16 and further the underlying oxide film 14, to form a number of polysilicon patterns 16A extending parallel with each other as represented in FIG. 2E. As a consequence of the patterning of the polysilicon film 16 and the underlying oxide film 14, the surface of the Si substrate 10 is exposed at a region 10A located between adjacent polysilicon patterns 16A.

Figure 2F:
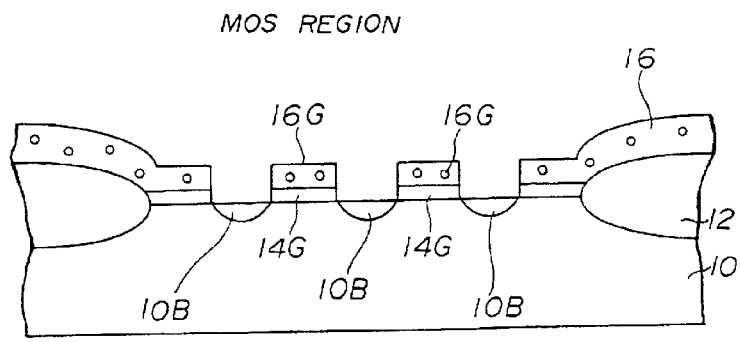

Simultaneously to the step of FIG. 2E, it should be noted that a gate electrode is formed outside the region of the substrate 10 on which the resistance element is formed, as a result of the patterning of the polysilicon film 16. As represented in FIG. 2F showing the region of the substrate 10 on which a MOS transistor is to be formed, it can be seen that a gate oxide film 14G and a gate electrode 16G are formed as a result of the patterning process of the oxide film 14 and the polysilicon film 16. In the step of FIG. 2F, it can be seen that diffusion regions 10B are formed in the substrate adjacent to the gate electrode 16G while using the gate electrode 16G as a self-alignment mask. As a consequence of forming the gate electrode 16G and the polysilicon pattern 16A from the common polysilicon film 16, the semiconductor device of the present embodiment has a structural feature such that the composition, including the impurity concentration level, of the polysilicon pattern 16A is identical with the composition of the gate electrode 16G.

Figure 2G:
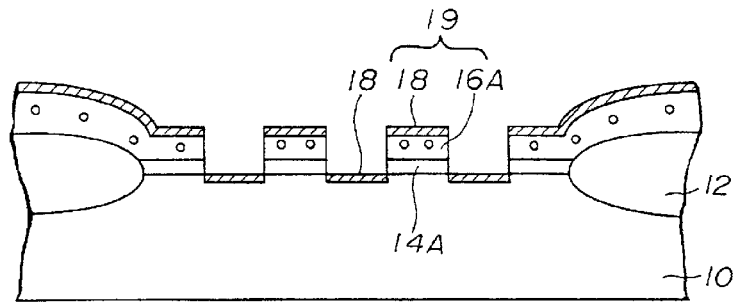

Next, in the step of FIG. 2G, a metal film 18 such as Ti, Co or W is deposited on the structure of FIG. 2E such that the metal film 18 covers the polysilicon patterns 16A and further the exposed regions 10A of the substrate 10.

Figure 2H:
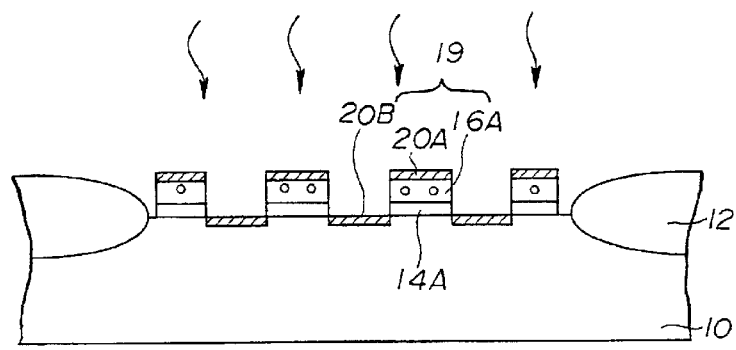

Next, a thermal annealing process is applied in the step of FIG. 2H to form a polycide region 20A on each of the polysilicon patterns 16A and simultaneously a salicide region 20B on the Si substrate 10 in correspondence to the foregoing exposed region 10A. The polycide region 20A and the underlying polysilicon pattern 16A form together a polycide pattern 19. It should be noted that each salicide region 20B thus formed in correspondence to the exposed region 10A is defined by the edges of the adjacent polycide patterns 19. In other words, the salicide region 20B is formed in a self-aligned relationship with respect to the adjacent polycide patterns 19.

Figure 2I:
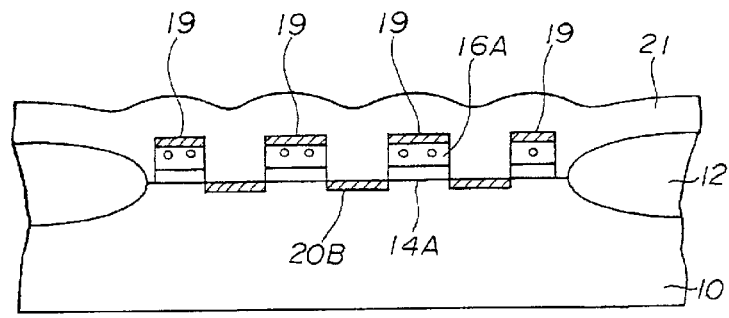
Figure 2J:
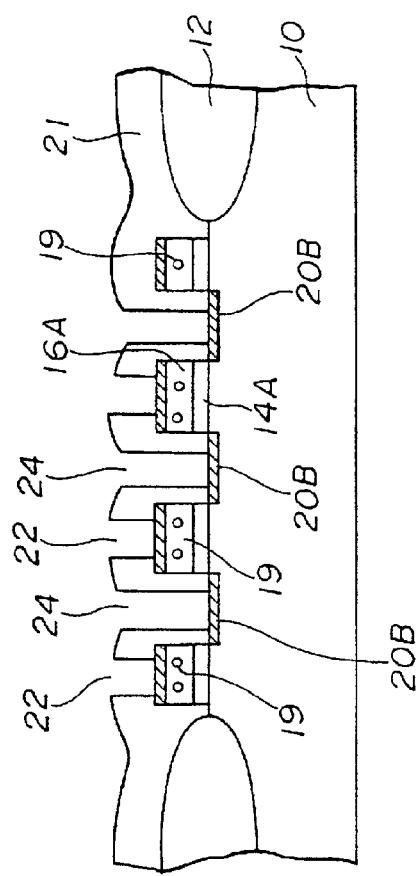

Next, in the step of FIG. 2I, an insulation film 21 is provided on the structure of FIG. 2H so as to cover the polycide patterns 19 and further the salicide regions 20B, and contact holes 22 and 24 are formed in the insulation film 21 in the step of FIG. 2J so as to expose the polycide patterns 19 and the salicide regions 20B, respectively.

Figure 2K:
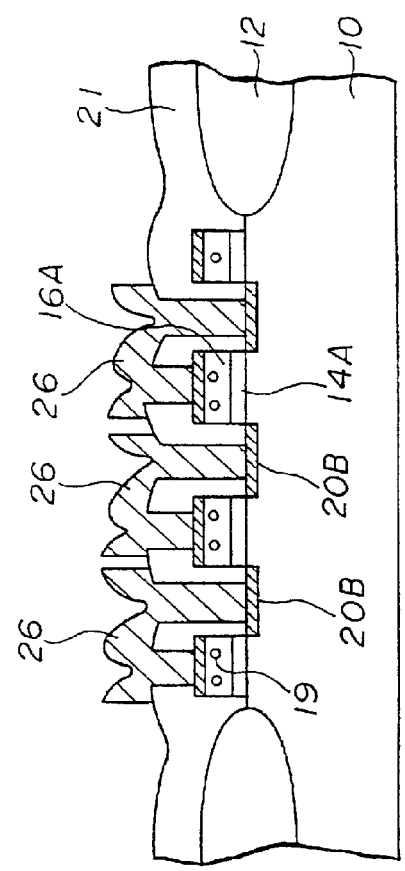

Finally, in the step of FIG. 2K, local interconnection patterns 26 of Al or Ti is provided on the insulation film 21 so as to connect a polycide pattern 19 to a corresponding salicide region 20B.

Figure 3:
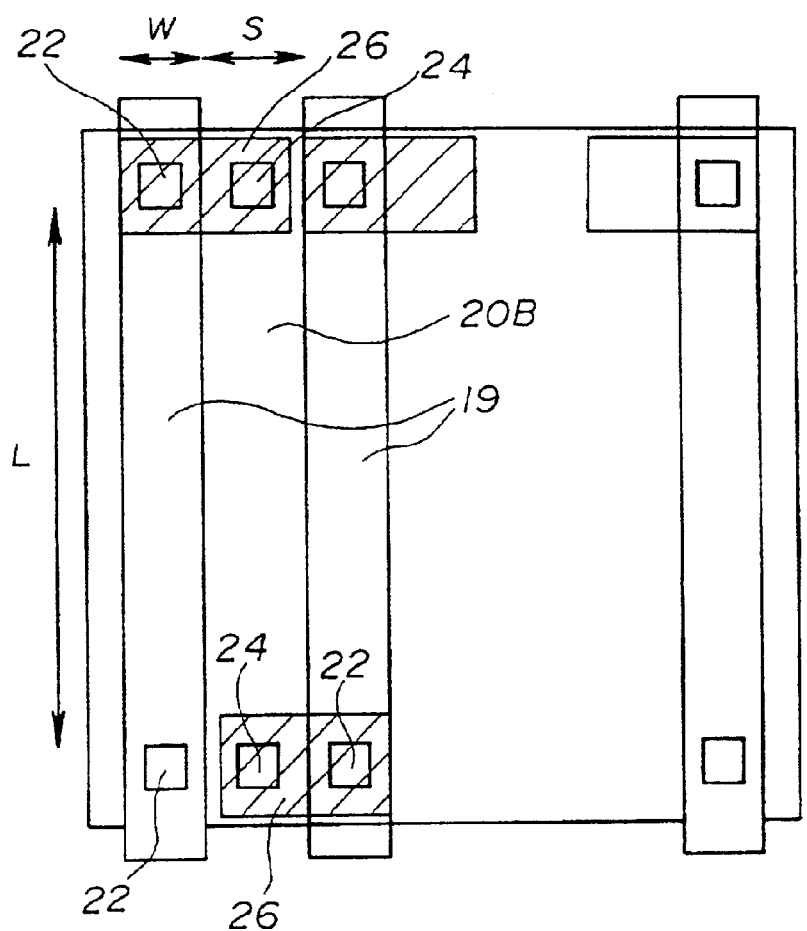
FIG. 3 is a diagram showing the construction of the resistance element of the first embodiment in a plan view.

As a result of the step of FIG. 2J, a structure represented in FIG. 3 is obtained, wherein it can be seen that the polycide patterns 19 and the adjacent salicide regions 20B are connected at the contact holes 22 and 24 formed at respective ends thereof by the local interconnection patterns 26, to form a resistance element in which the polycide patterns 19 and the salicide regions 20B are connected in series.

Figure 7:
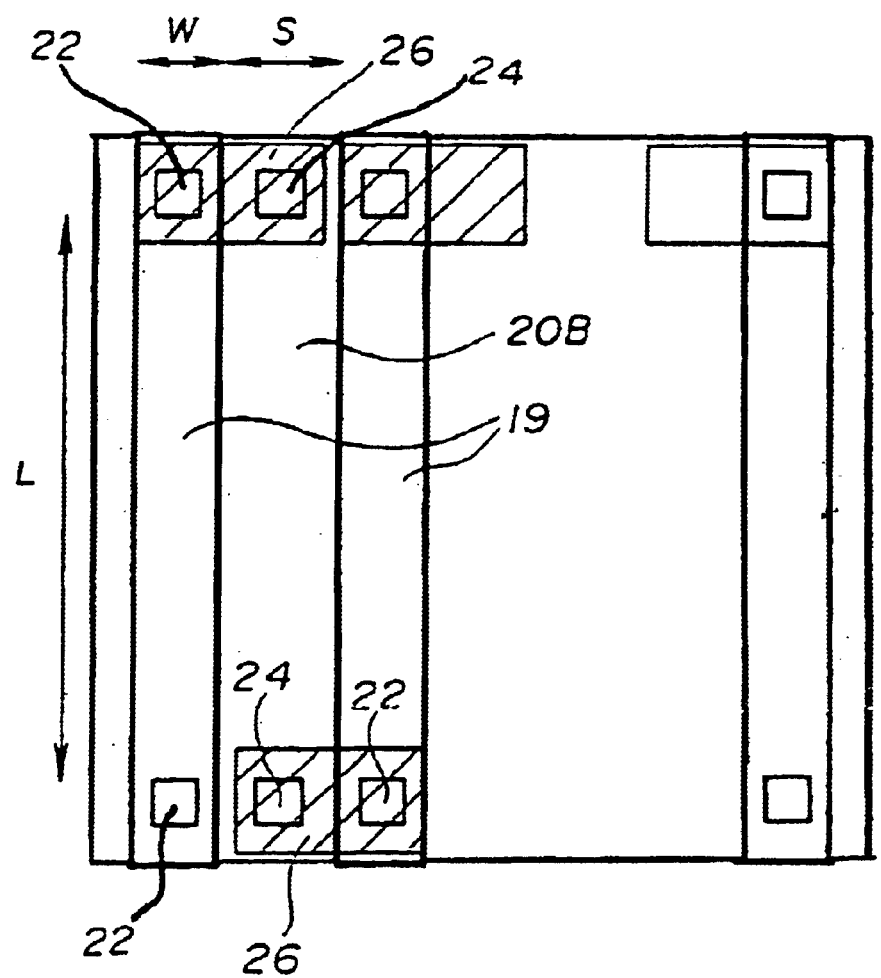
FIG. 7 is a diagram showing the construction of the resistance element in a plan view, according to another embodiment.

As can be seen in FIG. 3, the polycide patterns 19, each having a width W and a length L, are arranged in a parallel relationship with each other with a mutual separation S. Thereby, it can be seen (FIG. 7) that the salicide regions 20B are between adjacent polycide patterns 19 with a width S and the same length L. Thus when the width W of the polycide paterns 19 is increased or decreased, the width S of the salicide region 20B is decreased or increased, and the variation of the total resistance of the resistance element, caused as a result of the size variation of the polycide patterns 19, is effectively compensated for.

Figure 4:
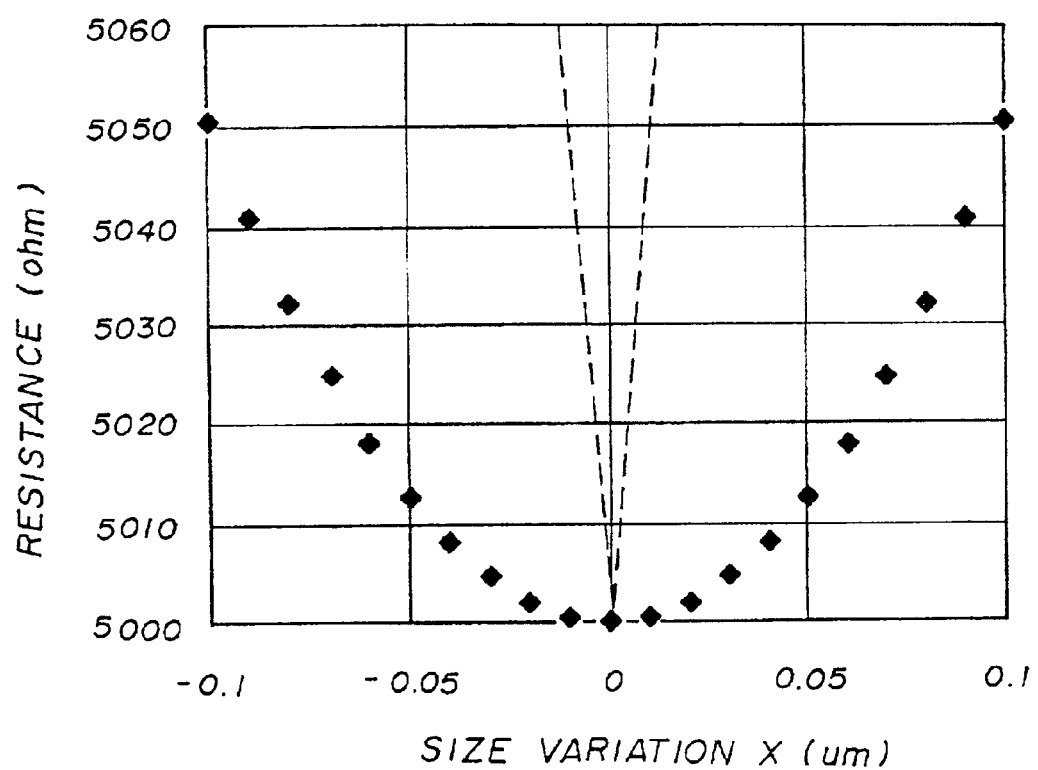
FIG. 4 is a diagram showing the effect of the resistance element of the first embodiment in comparison with the prior art.

FIG. 4 shows the resistance variation of the resistance element of FIG. 3 as a function of the size variation of the polycide patterns 19.

Referring to FIG. 4 showing the resistance f of the resistance element including five polycide patterns 19 each having the nominal width W of 1 $\mu$m and the length L of 100 $\mu$m and five salicide regions 20B each having the nominal width S of 1 $\mu$m and the length L of 100 $\mu$m, it can be seen that the resistance f is represented as a function of the size variation x with regard to the width W by a parabolic curve of which formula is given as $$f(x) = 2500/(1+x) + 2500/(1-x)$$
$$= 5000/(1+x)(1-x),$$

wherein it is assumed that both of the polycide pattern 19 and the salicide region 20B have a sheet resistance of 5 $\Omega/\square$ and that the size variation with regard to the length L is ignorable.

Figure 1:
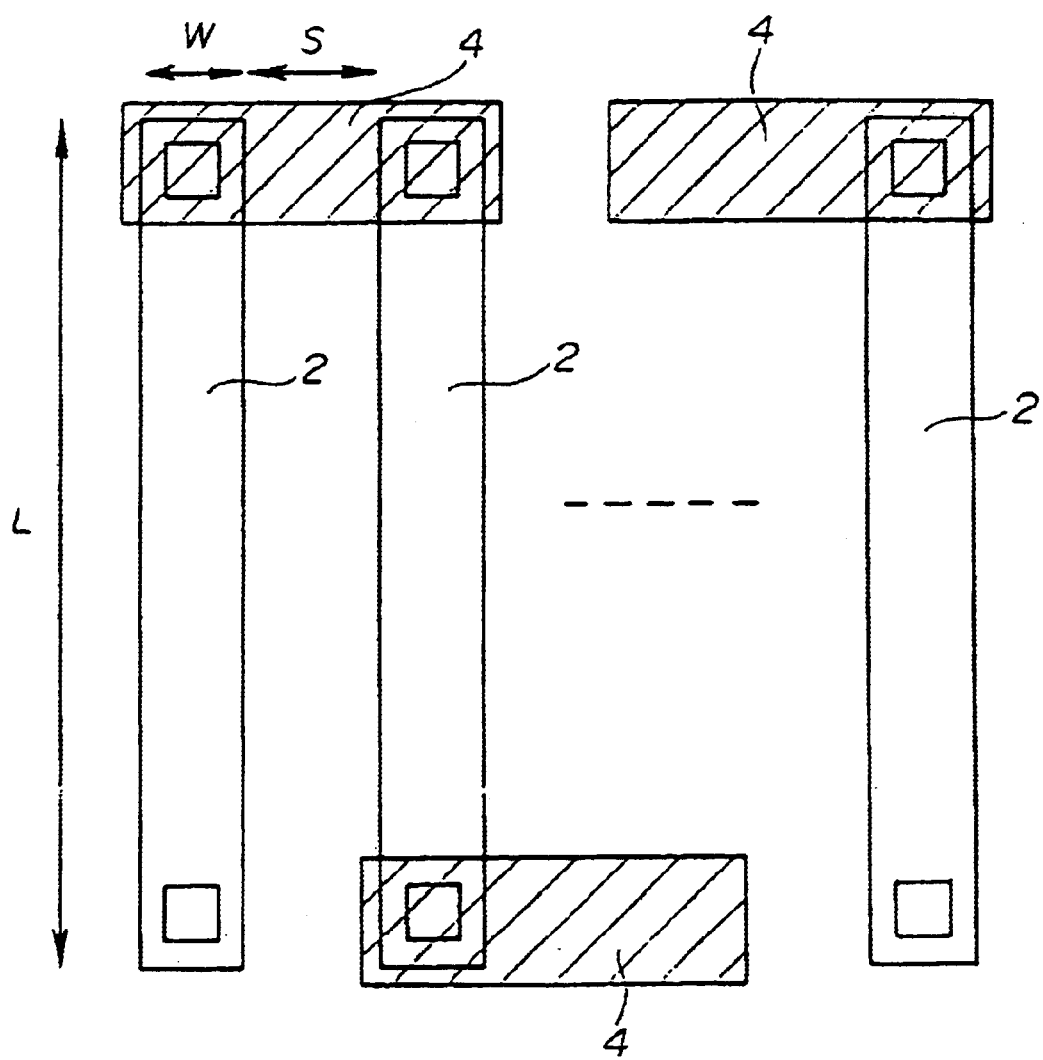
FIG. 1 is a diagram showing the construction of a conventional resistance element in a plan view.

For the sake of comparison, FIG. 4 also shows the corresponding resistance variation of the conventional resistance element of FIG. 1 by a broken line.

As can be seen clearly from FIG. 4, the resistance variation for the resistance element of FIG. 3 is reduced to ±50 $\Omega$ when the polycide patterns 19 are formed with a patterning precision of ±0.1 $\mu$m, while the magnitude of this resistance variation is smaller than the conventional case by the factor of 10 for the same patterning precision.

As explained before, this improvement is obtained due to the fact that each salicide region 20B is formed in a self-aligned relationship with respect to the polycide patterns 19 such that each salicide region 20B is defined by the edges of the adjacent polycide patterns 19. Thus, when the width W of the polycide pattern 19 is increased by +x $\mu$m, then the width S of the salicide region 20B is reduced by –x $\mu$m. When the width W is decreased by –x $\mu$m, on the other hand, the width S of the salicide region 20B is increased by +x $\mu$m. This self-compensation of the resistance variation appears most conspicuously when the polycide patterns 19 and the salicide regions 20B have generally the same resistance value.

As noted already with reference to FIG. 2B, the active region on which the resistance pattern is formed is doped with B, such that the threshold voltage of the parasitic MOS transistor, formed in the active region of the Si substrate 10 by the polycide pattern 19 acting as the gate electrode and the adjacent salicide regions 20B acting as the source and drain regions, exceeds the supply voltage of the semiconductor device. By doing so, turning-on of the parasitic MOS transistor is positively avoided even in such a case a voltage corresponding to the supply voltage appears across the resistance element.

[Second Embodiment]

Figure 5A:
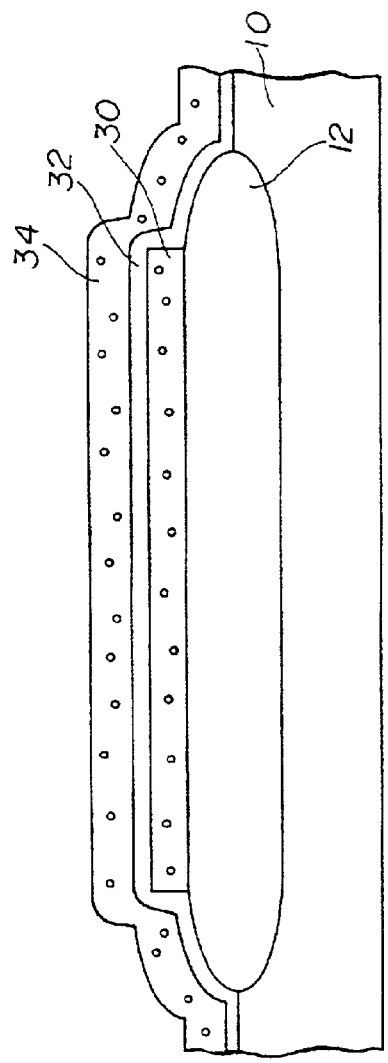
FIGS. 5A and 5B are diagrams showing the fabrication process of a resistance element according to a second embodiment of the present invention.
Figure 5B:
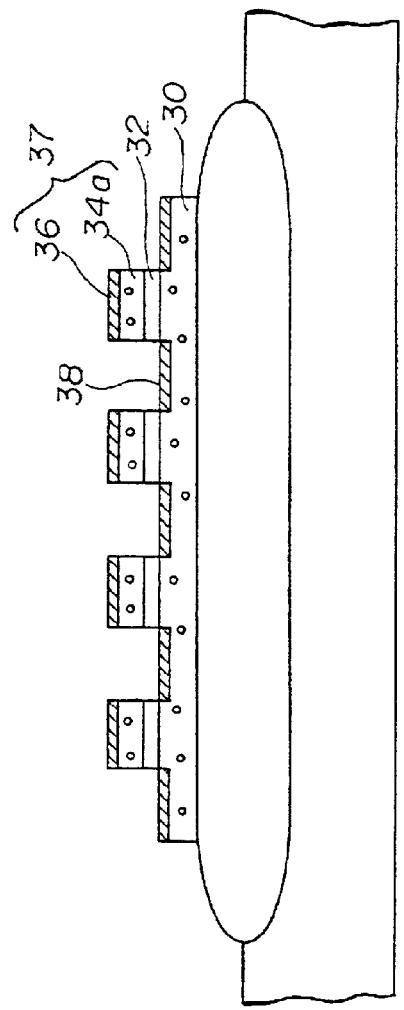

FIGS. 5A and 5B show the fabrication process of a semiconductor device, particularly the part including a resistance element, according to a second embodiment of the present invention, wherein those parts corresponding to the parts described previously are designated by the same reference numerals and the description thereof will be omitted.

Referring to FIG. 5A, a polysilicon film 30 is formed on the field oxide film 12 on the Si substrate 10 by a CVD process, with little or no impurity element added thereto, such that the polysilicon film 30 has a sheet resistance of $1 \times 10^6$ $\Omega/\square$ or more.

Further, an insulation film 32, which may be an $SiO_2$ film or an SiN film, is deposited on the substrate 10 so as to cover the polysilicon film 30 with a thickness such that no substantial breakdown occurs in the insulation film 32 even when a supply voltage is applied across the insulation film 32. In the case a supply voltage of 5 V is used, the insulation film 32 is formed to have a thickness of preferably larger than 15 nm. Further, a polysilicon film 34 is deposited on the insulation film 32 by a CVD process, wherein the polysilicon film 34 may have a composition identical with the composition of the lower polysilicon film 30. Alternatively, the polysilicon film 34 may contain a larger amount of impurity element.

Next, in the step of FIG. 5B, the upper polysilicon film 34 and the insulation film 32 are subjected to a photolithographic patterning process to form a number of polysilicon patterns 34a such that the polysilicon patterns 34a extend parallel with each other with a mutual separation, such that the lower polysilicon film 30 is exposed between adjacent polysilicon patterns 34a. After patterning the polysilicon patterns 34a, an ion implantation process of an impurity element such as $As^+$ is conducted under an acceleration energy of 40 keV with a dose of $5 \times 10^{15}$ cm$^{-2}$, for example, and provide an electrical conductivity to the surface part of the polysilicon patterns 34a and further the surface part of the exposed part of the polysilicon film 30.

Further, a metal film of Co, Ti or W is deposited on the structure thus formed with a thickness of about 60 nm, such that the metal film covers each of the polysilicon patterns 34a and further the exposed part of the lower polysilicon film 30. By applying a thermal annealing process to the structure thus obtained, a polycide region 36 is formed on each of the polysilicon patterns 34a. Further, a polycide region 38 is formed on the exposed part of the polysilicon film 30, wherein it will be noted that the polycide region 38 is formed in a self-alignment process that uses the polysilicon pattern 34a as a self-alignment mask. See the structure of FIG. 5B, wherein FIG. 5B represents the state in which the unreacted metal film is removed by an etching process. Thereby, the polycide region 36 and the underlying polysilicon pattern 34a form together a polycide pattern 37. Further, the polycide region 38 forms a polycide pattern 39.

Figure 6:
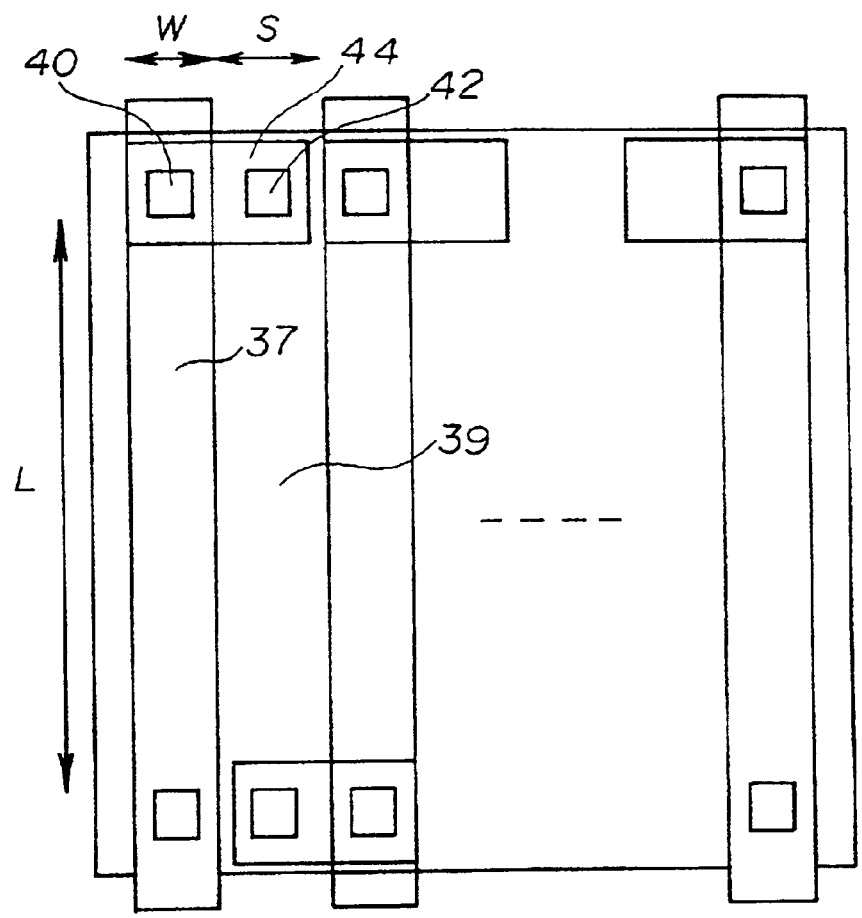
FIG. 6 is a diagram showing the construction of the resistance element of the second embodiment in a plan view.

Further, by providing a protective insulation film (not shown) on the structure of FIG. 5B and connecting an end part of the polycide pattern 37 and an end part of the polycide pattern 39 by a local interconnection pattern 44 as represented in FIG. 6, the polycide patterns 37 and the polycide patterns 39 are connected in series to form the desired resistance element. It should be noted that FIG. 6 shows resistance element in a plan view, wherein it can be seen that the local interconnection pattern 44 is connected to the polycide pattern 37 at a contact hole 40 formed in the protective insulation film and further to the polycide pattern 39 at a contact hole 42 formed also in the protective insulation film.

As the polycide pattern 39 is formed in a self-aligned relationship with respect to the polycide pattern 37, the increase in the width W of the polycide pattern 39 causes a corresponding decrease in the width S of the polycide pattern 39, and the variation of the total resistance of the resistance element is effectively compensated for, even in such a case the patterning process for patterning the polycide pattern 37 is conducted with an error, similarly to the case of FIG. 4.

In the present embodiment, it should be noted that the polysilicon pattern 34 may also constitute a gate electrode of a MOS transistor in the region outside the field oxide film 12. In such a case, the patterning of the gate electrode and the patterning of the polysilicon patterns 34a are conducted simultaneously. Thus, in the case a side-wall oxide film is to be formed at both side walls of the gate electrode in relation to the formation of the LDD (lightly doped drain) structure in the MOS transistor, similar side-wall oxide films are formed also on the side walls of the polysilicon pattern 34a as a result of the deposition and etch-back of an oxide film.

Further, the present invention is not limited to the embodiments described heretofore, but various variations and modifications may be made without departing from the scope of the invention.

What is claimed is:

1. A semiconductor device, comprising:

a Si substrate; and a resistance element formed on said Si substrate, said resistance element comprising:

a plurality of first resistance patterns of suicide provided on said substrate at a first level, said first resistance patterns being arranged in parallel with each other with a mutual separation; and a second resistance pattern of suicide provided adjacent to and between said first resistance patterns at a second level lower than said first level, said second resistance pattern being electrically connected in series to said first resistance patterns to form said resistance element, said second resistance pattern having an edge defined by said first resistance patterns, wherein each of the first resistance patterns and second resistance pattern has a substantially identical length, and each second resistance pattern is disposed between a corresponding pair of first resistance patterns, such that the first and second resistance patterns are configured in a complementary arrangement in an alternating sequence, and said second resistance pattern is formed on a device isolation film covering said substrate, said second resistance pattern including a first polysilicon pattern provided on said insulation film and a salicide region formed on a surface part of said first polysilicon pattern defined by said first resistance pattern.

2. A semiconductor device as claimed in claim 1, wherein said resistance element further includes an interlayer insulation pattern underneath said first resistance pattern with a shape in conformity with a shape of said first resistance pattern, said second resistance pattern being provided at a level lower than said interlayer insulation pattern.

3. A semiconductor device as claimed in claim 1, wherein said first resistance pattern includes a polysilicon pattern and a polycide region formed on said polysilicon pattern, said semiconductor device further comprising a MOS transistor having a polysilicon gate electrode having a composition substantially identical with a composition of said polysilicon pattern.

4. A semiconductor device as claimed in claim 1, wherein said first resistance pattern and said second resistance pattern have a substantially identical resistance.

5. A semiconductor device as claimed in claim 3, wherein said second resistance pattern is formed in said Si substrate in the form of a salicide region defined by said first resistance pattern.

6. A semiconductor device as claimed in claim 5, wherein said Si substrate includes an impurity element with a concentration level such that a parasitic MOS transistor, formed of said first resistance pattern acting as a gate electrode and a pair of said second resistance patterns at both lateral side of said first resistance pattern acting as source and drain regions, has a threshold voltage larger than a supply voltage used in said semiconductor device.

7. A semiconductor device as claimed in claim 1, wherein said first resistance pattern includes a second polysilicon pattern and a polycide region formed on said second polysilicon pattern, said second polysilicon pattern having an impurity concentration level substantially larger than an impurity concentration level of said first polysilicon.

* * * * *